(12) United States Patent
Calvarese

(10) Patent No.: US 11,573,138 B2
(45) Date of Patent: Feb. 7, 2023

(54) DOUBLY INTERLACED SENSOR ARRAY AND METHOD TO SUPPORT LOW POWER COUNTING AND IDENTIFICATION

(71) Applicant: ZEBRA TECHNOLOGIES CORPORATION, Lincolnshire, IL (US)

(72) Inventor: Russell Calvarese, Stony Brook, NY (US)

(73) Assignee: Zebra Technologies Corporation, Lincolnshire, IL (US)

( * ) Notice: Subject to any disclaimer, the term of this patent is extended or adjusted under 35 U.S.C. 154(b) by 534 days.

(21) Appl. No.: 16/737,708

(22) Filed: Jan. 8, 2020

(65) Prior Publication Data

US 2021/0208013 A1 Jul. 8, 2021

(51) Int. Cl.
| | |
|---|---|
| *G01L 1/00* | (2006.01) |
| *G01L 1/22* | (2006.01) |
| *G01D 5/24* | (2006.01) |
| *G01V 8/20* | (2006.01) |
| *H05K 1/11* | (2006.01) |

(52) U.S. Cl.
CPC ................ *G01L 1/225* (2013.01); *G01D 5/24* (2013.01); *G01V 8/20* (2013.01); *H05K 1/11* (2013.01)

(58) Field of Classification Search
CPC . G01L 1/225; G01D 5/24; G01V 8/20; H05K 1/11
See application file for complete search history.

(56) References Cited

U.S. PATENT DOCUMENTS

| | | | | |
|---|---|---|---|---|
| 5,253,656 | A * | 10/1993 | Rincoe | A61F 2/76 600/595 |
| 6,064,759 | A * | 5/2000 | Buckley | G01B 11/024 348/125 |
| 6,208,250 | B1 * | 3/2001 | Dixon | A61G 7/0509 340/572.1 |
| 11,101,408 | B2 * | 8/2021 | Hussell | H01L 33/486 |
| 11,108,374 | B1 * | 8/2021 | Lower | H03H 9/70 |
| 2003/0019933 | A1 * | 1/2003 | Tsikos | G02B 19/0085 235/454 |
| 2004/0104826 | A1 * | 6/2004 | Philipp | G01D 5/24 341/33 |
| 2005/0011738 | A1 * | 1/2005 | Smith | A61B 5/1113 200/85 R |

(Continued)

FOREIGN PATENT DOCUMENTS

WO 2014053746 A1 4/2014

OTHER PUBLICATIONS

International Search Report and Written Opinion for International Application No. PCT/US2021/012278 dated May 24, 2021.

*Primary Examiner* — Max H Noori

(57) ABSTRACT

Systems and methods for providing low-power sensing, identification, and sweep detection for items on a sensor mat are provided. Item detection sensors are provided in grid on a sensor mat. A first subset of the item detection sensors are sensed at a first time, and a second subset of the item detection sensors are sensed at a second time. The item detection sensors of the first and second subsets are chosen such that they span the surface of the sensor mat, and so that the sensors of the chosen subsets include all of the sensors of the mat after multiple sensing steps have been completed.

8 Claims, 5 Drawing Sheets

(56) References Cited

U.S. PATENT DOCUMENTS

| | | |
|---|---|---|
| 2006/0071774 A1 | 4/2006 | Brown et al. |
| 2009/0279082 A1* | 11/2009 | Till ..................... B07C 5/3408 356/240.1 |
| 2010/0292945 A1* | 11/2010 | Reynolds ............. G06F 3/0446 702/65 |
| 2011/0037597 A1* | 2/2011 | Dixon .................. A61G 7/0513 340/573.4 |
| 2011/0120228 A1 | 5/2011 | Main et al. |
| 2014/0201041 A1 | 7/2014 | Meyer |
| 2017/0074652 A1* | 3/2017 | Send ..................... G06F 3/0423 |
| 2017/0205230 A1* | 7/2017 | Send ..................... G01S 7/481 |
| 2022/0109091 A1* | 4/2022 | Koduri ................... H01L 24/24 |

* cited by examiner

DOUBLY INTERLACED SENSOR ARRAY AND METHOD TO SUPPORT LOW POWER COUNTING AND IDENTIFICATION

BACKGROUND

Shopkeepers increasingly use item-sensing mats on store shelves to serve a variety of purposes. These mats may be placed directly on the shelves, with items placed on top of them. When properly powered and connected, the mats can detect items that are placed on them. Some systems including the mats can identify and/or count the items and identify when items are removed. The mats can also alert shopkeepers when many items are removed simultaneously, in a so-called "sweep," which may indicate that shoplifting or other unexpected activity is happening.

Sensing mats may periodically run a sensing process to determine the status of items on the mat, and this process requires power. It is important that the mats conserve power, because the power supply available to sensing mats is often limited. Therefore, it will be beneficial to have sensing mat systems and methods that conserve power in their sensing processes.

SUMMARY

In one embodiment, the present invention is a sensor mat comprising a first substrate configured to form a lower portion of the mat; a second substrate configured to form an upper portion of the mat; a first plurality of electrical traces positioned between the first substrate and the second substrate, each of the first plurality of electrical traces being substantially parallel to each other of the first plurality of electrical traces; a second plurality of electrical traces positioned between the first substrate and the second substrate, each of the second plurality of electrical traces being substantially parallel to each other of the second plurality of electrical traces, the first plurality of electrical traces and the second plurality of electrical traces being laid out such that each of the first plurality of electrical traces at least one of overlaps and passes under each of the second plurality of electrical traces, the first plurality of electrical traces and the second plurality of electrical traces being further laid out such that each of the second plurality of electrical traces at least one of overlaps and passes under each of the first plurality of electrical traces; and a drive circuit communicatively coupled to each of the first plurality of electrical traces and the second plurality of electrical traces, the drive circuit including a first plurality of banks configured to interface the first plurality of electrical traces and a second plurality of banks configured to interface the second plurality of electrical traces, wherein one of the first plurality of banks is configured to transmit sense-data to a first sub-plurality of electrical traces and one of the second plurality of banks is configured to receive sense-data from a second sub-plurality of electrical traces, the first sub-plurality of electrical traces being formed by a non-adjacent series of some of the first plurality of electrical traces, the second sub-plurality of electrical traces being formed by a non-adjacent series of some of the second plurality of electrical traces.

In another embodiment, the present invention is a system detecting the presence of or information about objects comprising a mat having a detection surface for the placement of objects; sensor hardware consisting of a first set of parallel conductors disposed along a first axis of said detection surface and a second set of parallel conductors disposed along a second axis of said detection surface, said second axis being at an angle crossing said first axis; and powering and detection hardware configured to power said first set of conductors and detect signals at nodes formed by the intersection with said second set of conductors, said powering and detection hardware being configured to power a first subset of said first set of conductors and to detect signals from a second subset of said second set of conductors, wherein said first subset of said first number of conductors and said second subset of said second set of conductors are chosen such that each of the first subset and the second subset form an intersecting node pattern that spans said detection surface along both axis with a substantially lower density than that formed by intersections of all conductors of the first and second sets.

In another embodiment, the present invention is a system for detecting the presence of or information about objects comprising a mat having a detection surface for the placement of objects; sensor hardware consisting of a grid of item detection sensors, said grid having first and second axes; and detection hardware configured to detect signals from a first subset of said item detection sensors at a first time and to detect signals from a second subset of said item detection sensors at a second time; wherein said first subset of said item detection sensors and said second subset of said item detection sensors are chosen such that each of the first subset and the second subset form a detection pattern that spans said detection surface along both axes with a substantially lower density than that formed by all of said item detection sensors.

In another embodiment, the present invention is a method of detecting the presence of or information about objects comprising: providing a mat having a detection surface for the placement of objects and a plurality of sensor nodes; selecting and scanning a first subset of said sensor nodes; selecting and scanning a second subset of said sensor nodes; determining whether the steps of selecting and scanning said first and second subsets of sensor notes has resulted in all of said sensor nodes having been scanned; and continuing to select and scan additional subsets of said sensor nodes until all of said sensor nodes have been scanned.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
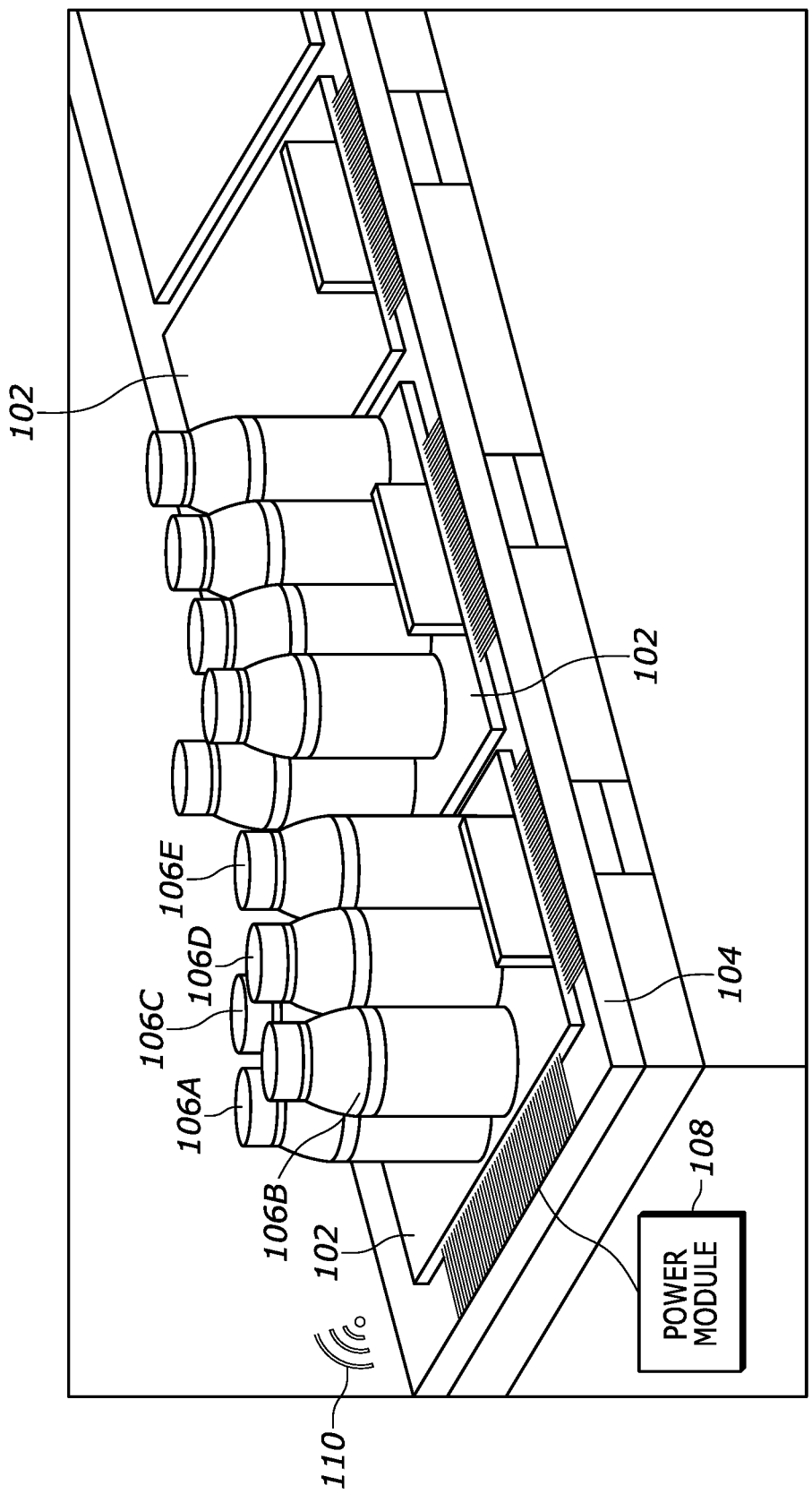
FIG. 1 illustrates a sensor pad system having items placed on it in a retail environment.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

One embodiment of the present invention is shown in FIG. 1. A sensor mat 102 is placed on a shelf 104 and has retail items 106a-e (such as beverage bottles or cans, for example) placed upon it. The sensor mat 102 is powered by a power module 108, which may power the sensor mat 102 using energy harvesting (such as ambient light) or a battery or building power. The power module 108 may use ambient light (for example, light provided by store lighting) to charge a battery or capacitor within the module, and as needed power can be trickled to the mat. Mats 102 according to the present invention may be provided with wired or wireless networking capabilities (shown via the wireless signals 110) to enable the provision of data regarding sensed items to store personnel.

The mats 102 have within them sensors that are provided in a grid, with sensors disposed along two axes of the grid. The sensors are ideally provided at such a resolution, and sensed and reported with such timing, that the placement, movement, or removal of any item 106 or group of items 106 is sensed within a reasonable amount of time so that store personnel and inventory management systems can be informed of the change. If the mats 102 are provided with an uninterrupted, large power supply, reporting of changes in the items 106 on the mats 102 can be done essentially in real-time, while reading and reporting on the status of each sensor within each mat 102.

However, in practice, a variety of factors prevent the mats from being provided with a large and constant power supply. For example, store shelves are often very long and plentiful, and are not situated such that wiring may easily be provided to each mat 102 within a store. Store shelves may also be rearranged relatively frequently, making wiring mats 102 placed on store shelve unmanageable. Thus, it is desirable for the power modules 108 to run off power provided by energy harvesting (such as ambient light) or batteries, and to consume a very small amount of power in regular usage.

In order to enable the mats 102 to provide useful item sensing ability while consuming as little power as reasonably possible, embodiments of the present invention enable the activation and reading of fewer than all of the sensors provided within each mat 102, while also ensuring that substantially the entire mat surface is sensed and read on a regular basis.

Sensor mats 102 for use with the present invention may use a range of different technologies to sense the presence of items 106, the types of items, and the addition or removal of single items or multiple items. Sensing that may be used with the present invention include capacitance sensing switches, optical sensors, and simple switches at each sensing node. Printed mechanical switches may be used in one embodiment.

Figure 2:
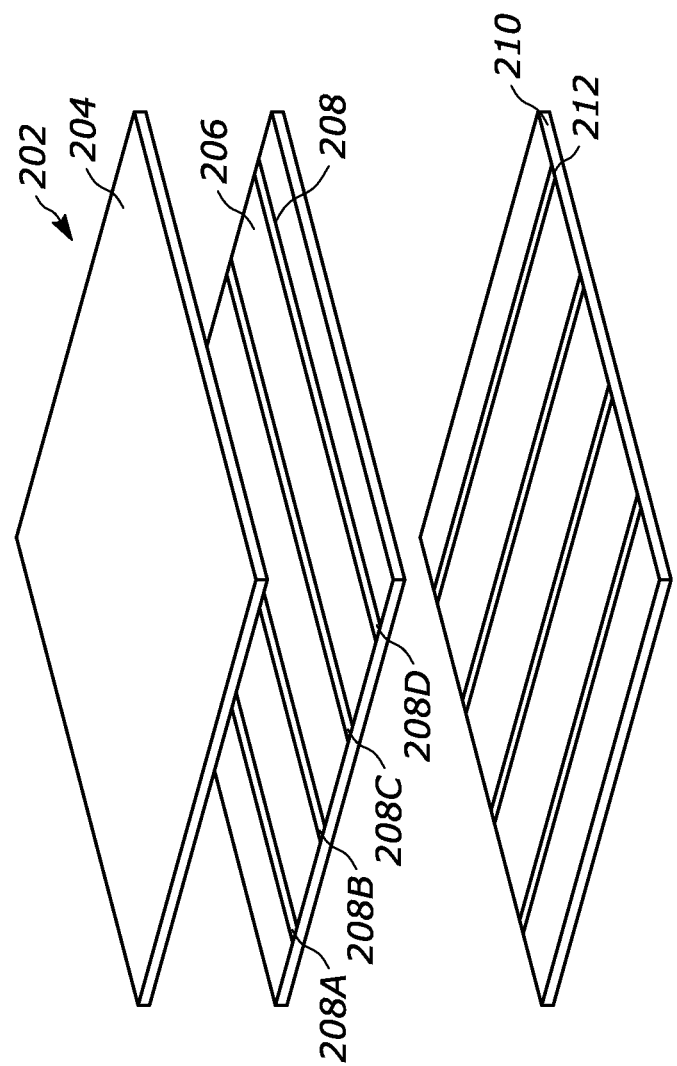
FIG. 2 illustrates the layers of a force sensitive resistor array for use in one embodiment of the present invention.

One detection technology that may be used with the present invention is the force-sensitive resistor array. FIG. 2 shows layers of a force-sensitive resistor array 202. The force-sensitive resistor (FSR) array 202 consists of a number of layers. A top surface 204 spreads forces to inner layers and protects inner layers, and may be made of a flexible material such as Poron or vinyl. Below the silicone layer is a substrate layer 206 (made of, for example, PET), with a first set of conductors 208 provided on the bottom of the substrate layer. In one embodiment, the conductors 208 are silver traces deposited or printed on the substrate layer 206. The conductors 208 are provided with a resistive coating to enable FSR behavior and prevent oxidation of the conductors.

Shown on the bottom of FIG. 2 is another substrate layer 210 (also made of, for example, PET) having a second set of conductors 212 provided thereon. Optionally, these conductors 212 also have a resistive coating to prevent their oxidation. Optionally, there is a bottom layer (not shown in FIG. 2) to provide more structural integrity or protection to the array 202. Typically, the substrate layers 206 and 210 extend about a half inch beyond the conductors 208 and 212, with the substrate layers being glued together to hold the array together. There may be standoffs provided to prevent gravity from allowing the conductive traces to touch if there is nothing placed on the mat.

In normal operation, voltage placed on any of the first set of conductors 208 will not cause current flow through the second set of conductors 212 because they are separated by a resistive layer. However, the resistive layer is thin enough that when the top surface 204 is touched, voltage placed on the first set of conductors 208 will cause current flow through the second set of conductors 212. Such a system thus allows a determination of where pressure is placed on a sensor mat, because only the conductors in the area of pressure will be placed closer together, thus allowing current from one set of conductors to flow through a second set of conductors.

To detect touch, voltage may be placed sequentially on adjacent conductors of the first set of conductors 208, and then a current detection step can be done on the second set of conductors 212. In a typical scan, voltage will be placed on conductor 208a, and then a sensing step will be performed on all of the conductors 212 so that it can be determined where the conductors have been pressed together, allowing current to flow. Then, voltage will be placed on conductor 208b and a second sensing step will be performed, and so on with conductors 208c and 208d. Through this process, it can be determined where the conductors 208 and 212 are being pressed together, and thus where on a sensor mat 102 items have been placed. Performing such a scan of an entire sensor pad, which may have hundreds of conductors in each conductive layer, takes a significant amount of power.

Figure 3:
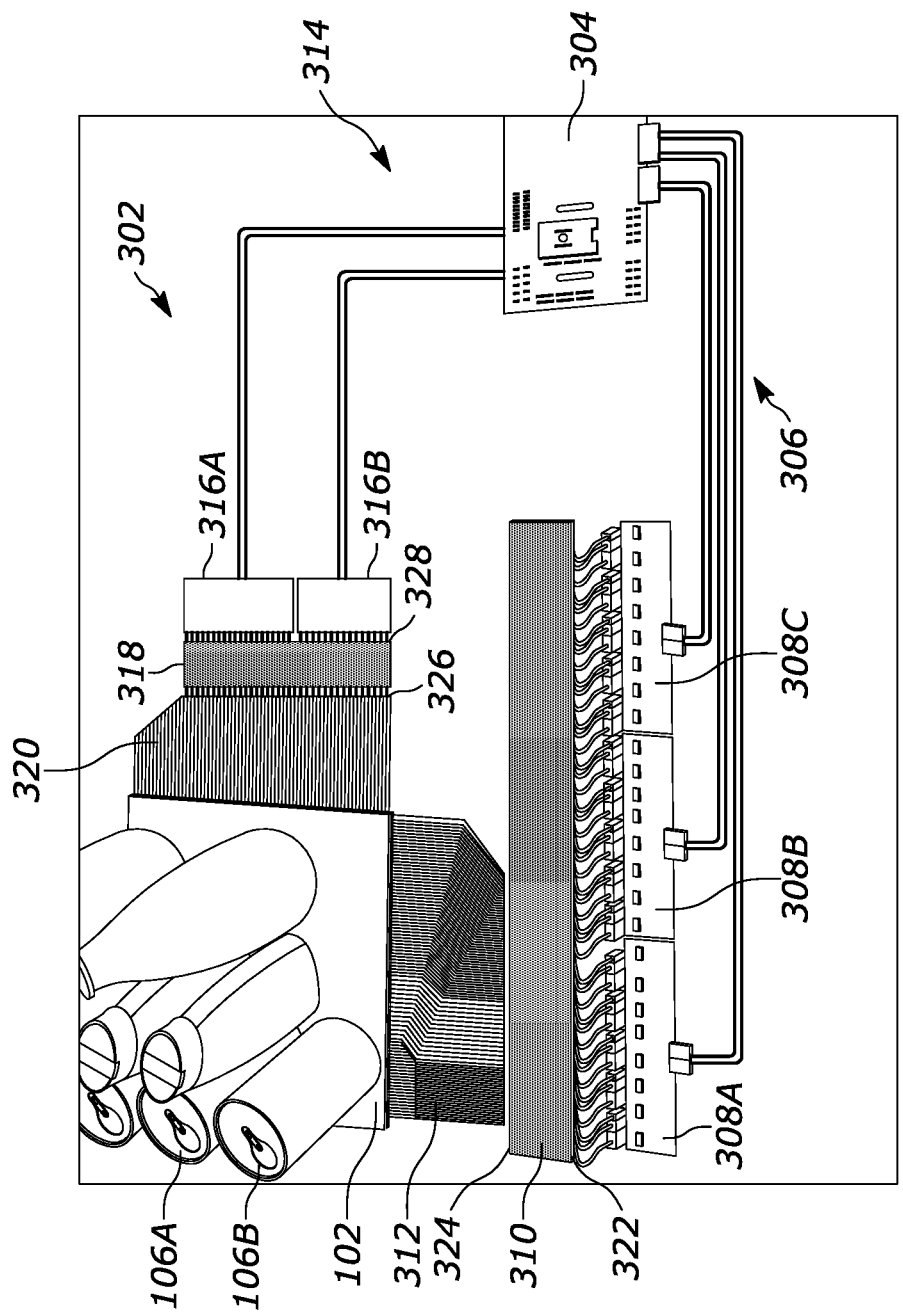
FIG. 3 illustrates a sensor pad system according to one embodiment of the present invention.

This power consumption can be reduced by interlacing conductors used in the scans. FIG. 3 shows a system for interlacing conductors. The sensor mat 102 is used in an interlacing system 302. The logic and signaling of the interlacing system 302 is controlled by a system-on-chip (SOC) module 304. In one embodiment, the system-on-chip module 304 has wireless communication capability, such as Bluetooth Low Energy communications hardware.

The SOC module comprises drive circuitry and coordinates the driving of conductors along one axis of the sensor mat 102 and the sensing of conductors along the other axis of the sensor mat 102. In the embodiment of FIG. 3, the SOC module 304 is connected via horizontal interlace connection wires 306 to column drive boards 308a-c. Conductive connections from the column drive boards 308a-c are routed through a horizontal interlace board 310, through a flexible film 312 provided with conductors, to the vertically-disposed or "column" conductors within the sensor mat 102.

Likewise, the SOC module 304 is also connected via vertical interlace connection wires 314 to row sense boards 316a-b. Conductive connections from the row sense boards 316a-b are routed through a vertical interlace board 318, through a flexible film 320 provided with conductors, to the horizontally-disposed or "row" conductors within the sensor mat 102.

In this embodiment, voltage is placed on the column conductors within the sensor mat 102, in a sequential manner via the column drive boards 308, and in locations where items 106 are placed, a conductive connection is completed between the column conductors and the row conductors. These conductive connections are sensed via the row sense boards 316. The information on the locations of the conductive connections is provided to the SOC module 304, which can provide information on the number, the location, and in some cases the types of items on the sensor mat 102.

In a full scan, all of the column conductors will be driven and all of the row conductors will be sensed. However, as described above, the completion of a full scan is an event that uses a large amount of power. Given the low power available to the system 302, it is desirable to conduct scans that are sufficient for the purpose of determining the status of the items 106, while using less power per scan.

Lower-power selective scans are performed by driving only a selected subset of the column conductors of the sensor pad 102 and sensing only a selected subset of the row conductors. In the embodiment of FIG. 3, this is accomplished through the use of the interlacing boards 310 and 318. The horizontal interlacing board 310 receives at its inputs 322 drive signals originating from the SOC module 304. Without the interlacing board present, these signals would be forwarded directly to the column conductors of the sensor pad 102, such that, in sequence (and, either consecutively, or in some cases simultaneously), the column conductors would all be driven for a full scan. In one embodiment, the drive circuitry within the SOC module 304 may be provided in "banks" that drive and sense subsets of conductors.

The horizontal interlace board 310, however, rearranges the connections between the column drive boards 308 and the column conductors of the sensor pad 102 so that, via its outputs 324, subsets of the column conductors are driven, and further so that these subsets span the entire horizontal expanse of the sensor pad 102. Likewise, the vertical interlace board 318 rearranges the connections between the row conductors of the sensor pad 102 and the row sense boards 316 so that, via its inputs 326, subsets of the row conductors are sensed, and further so that these subsets span the entire vertical expanse of the sensor pad 102. The interlaced signals showing completion or non-completion of a circuit between the column conductors and the row conductors is sent to row sense boards 316 via the outputs 328 of the vertical interlace board 318.

If, for example, a horizontal interlace board is provided with 3:1 interlacing, signals from the SOC module that, in the absence of the interlace board, would drive the first six column conductors would instead drive conductors number 0, 3, 6, 9, 12, and 15.

Multiple drive and sense boards are shown in FIG. 3, but it is possible to use only one column drive board and one row sense board. In some embodiments, the selection of conductors for selective scanning may be carried out completely on a properly programmed SOC, without the need for interlacing boards.

Figure 4:
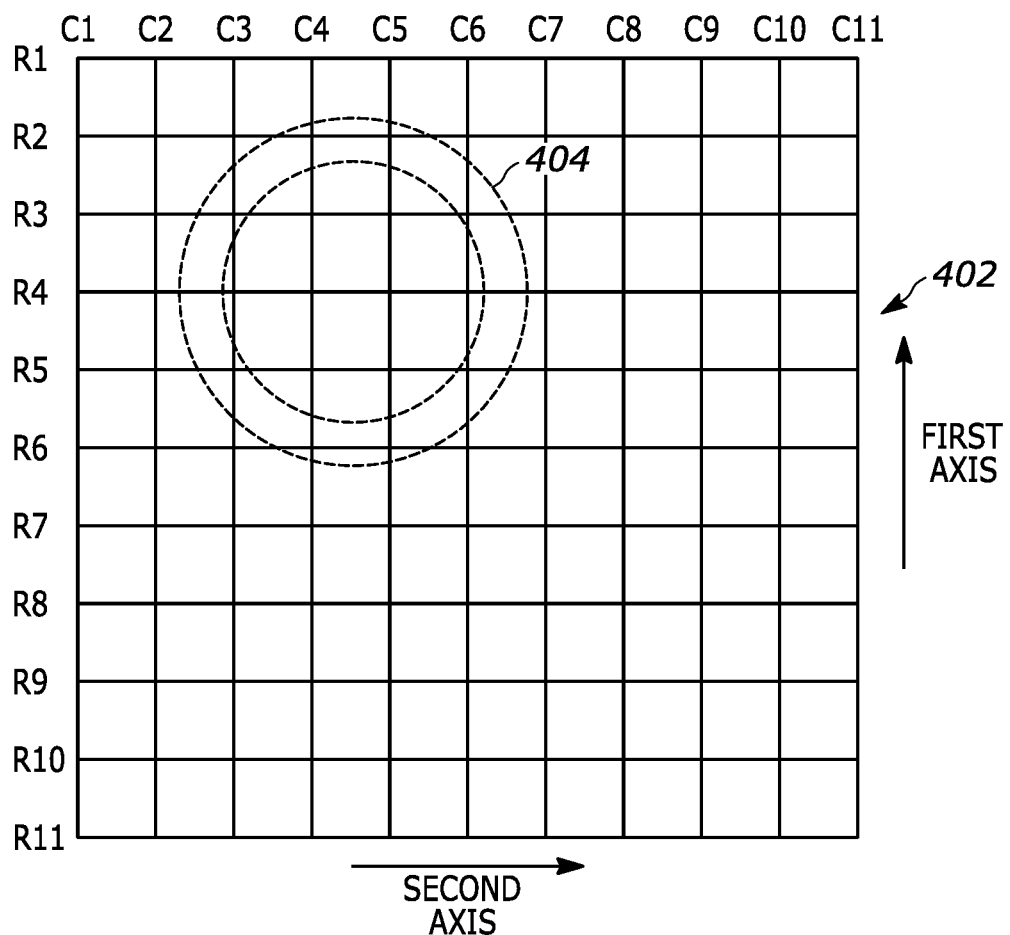
FIG. 4 illustrates a sensor grid according to one embodiment of the present invention.

Interlacing of the driving and sensing of the conductors is further illustrated in FIG. 4, which shows a simplified grid 402 of column conductors C1 through C11 running along a first axis and row conductors R1 through R11 running along a second axis. A small number of conductors is used here for illustration purposes; by contrast, in the embodiment of FIG. 3, for example, there are 192 column conductors and 128 row conductors.

In a full scan, all column conductors C1 through C11 are driven, and all row conductors R1 through R11 are sensed. In a power-saving interlaced scan, row conductors are driven and column conductors are sensed according to the interlace ratio, as may be implemented by the interlacing boards. For example, in a 2:1 horizontal interlace, column conductors C1, C3, C5, C7, C9, and C11 may be driven. In a 2:1 vertical interlace, row conductors R1, R3, R5, R7, R9, and R11 may be sensed. Such interlacing significantly reduces the power required to conduct a scan, while also reducing the resolution of the resulting scan.

Interlacing (and the use of interlacing boards) can take on a variety of forms. For example, it may be beneficial to use two horizonal interlacing boards and two vertical interlacing boards, rather than a single one of each. This can reduce the number of traces needed per board and therefore allow for narrower PCBs to be used for the interlacing boards.

Interlacing and scan selection can be chosen so that, for example, only half of the mat is scanned with a selected sensor set, and another half is scanned with the other selected set, with these scans being performed quickly enough that the entire mat is scanned within a reasonable time period for the application (for example, once every two seconds).

In FIG. 4, an outline 404 of an impression of an item 106 is shown. While the intersections of conductors that will result in sensing can be somewhat unpredictable, in a full scan it can be seen that the intersections of column conductors C3-C6 and row conductors R2-R6 will certainly result in detected currents and the detection of the item 106. If the vertical and horizontal interlaces are both at a 2:1 ratio as described above, the intersections of column conductors C3 and C5 and row conductors R3 and R5 will result in detected currents and the detection of the item 106. Interlace ratios are chosen so that the resolution of the resulting scan will detect the types of items that are placed on a sensor pad 102.

In one embodiment, the SOC module 304 is configured so that driving and sensing of interlaced conductors is done in such a manner that sequential interlaced scans, over a period of time, will result in a complete scan of all the conductor intersections. Returning to FIG. 4, for example, in a 3:1 horizontal and vertical interlace, in a first interlaced scan column conductors C1, C4, C7, and C10 may be driven and row conductors R1, R4, R7, and R10 may be sensed. In a second interlaced scan, column conductors C2, C5, C8, and C11 may be driven and row conductors R2, R5, R8, and R11 may be sensed. And in a third interlaced scan, column conductors C3, C6, and C9 may be driven and row conductors R3, R6, and R9 may be sensed. Thus, over a period of time, though each scan is an interlaced scan, the effective result is that impressions on the entire set of intersections of all of the column conductors and row conductors are detected.

Different interlace ratios may be used for the column and row conductors. For example, if a horizontal interlace of 2:1 and a vertical interlace of 3:1 are used, that results in six different interlace combinations. Progressively scanning different combinations each time will result in a full scan of the entire sensor mat 102 after six scans.

Figure 5:
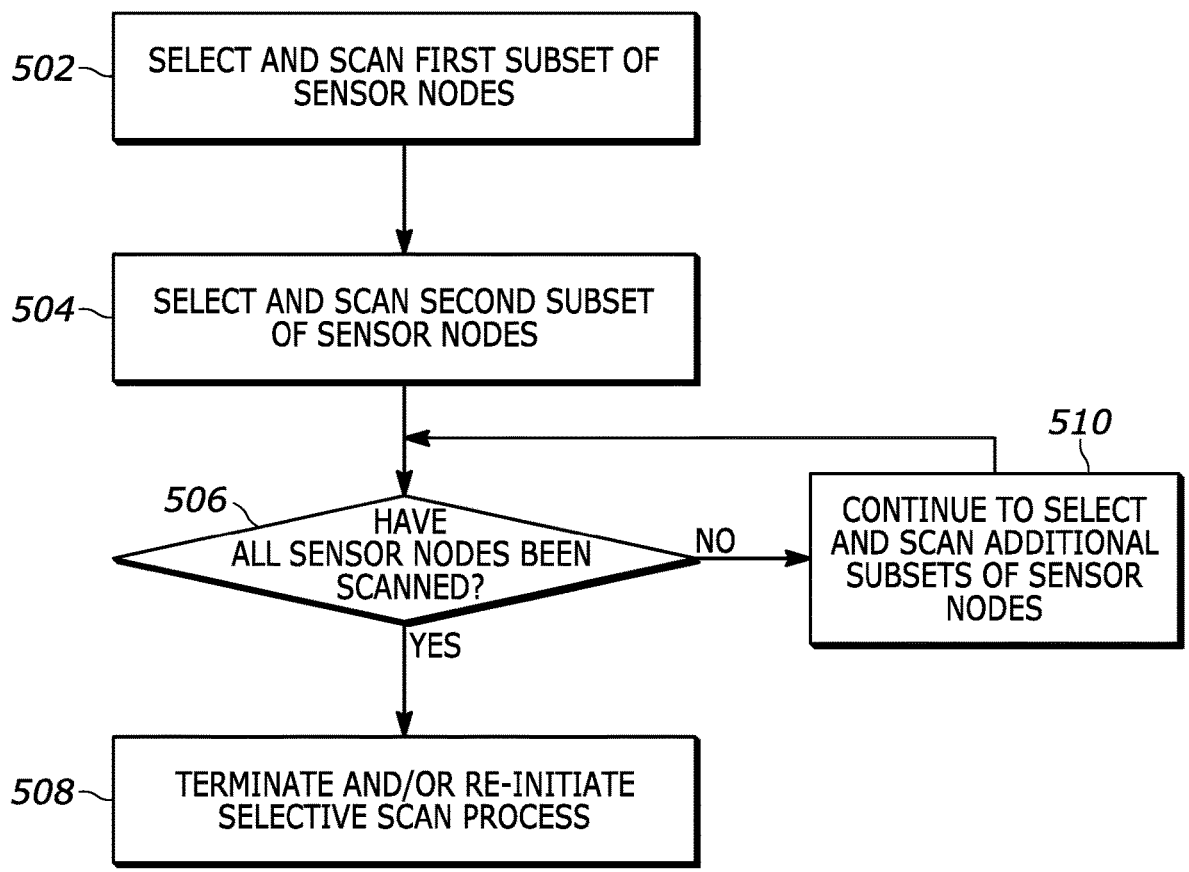
FIG. 5 Illustrates a block diagram of a sensor scanning process according to one embodiment of the present invention.

The process selection of detection points is shown in FIG. 5. Using the FSR sensing technology described above, each intersection of a column conductor and a row conductor can be considered a "sensor node." As shown at block 502 a first subset of sensor nodes is selected and scanned, and then a second subset of sensors is selected and scanned as shown at block 504. At decision block 506, it is determined whether all of the sensor nodes of the sensor pad 102 have been scanned. If all of the nodes have been scanned, the selective scanning mode is terminated or re-initiated as shown at block 508. If at the decision block 506, not all of the nodes have been scanned, the system proceeds to block 510 and continues to select and scan additional subsets of sensor nodes until all of the nodes have been scanned.

Sensor nodes for scans may be selected in a non-interlaced fashion. That is, they may be selected somewhat randomly, but it is important that in each selective (non-full) scan, the selected sensors span the entire mat, so that ideally even the removal or placement of a single item 106 on a sensor mat can be detected.

As an example of the resolution of full scans as compared to selective or interlaced scans, some sensor pads 102 are provided with conductors having spacing of 0.125 inches between conductive traces. If interlaced scans are done at 5:1 for the rows and 2:1 for the columns, this results in effectively detecting force on the pad every 0.625 inches horizontally and every 0.25 inches vertically.

In one embodiment of the invention, an interlaced scan is performed every two seconds. In an example where interlacing is done at 3:1 in the vertical direction and 4:1 in the horizontal direction, if the interlaced conductors are chosen correctly, effectively the entire mat will be scanned every twenty-four seconds (because there are 12 possible combinations of conductors, and 2 seconds×12 combinations=24 seconds). This can be the primary mode of operation for the sensor mat, and at other intervals (for example, every three minutes) a full scan can be conducted.

Detection frequency is chosen so that shop personnel can be adequately informed of item removal and so that alarms can be provided in the event of a sudden, unexpected removal of some or all of the items from a sensor pad.

Systems of the present invention can inform stocking personnel of the need for restocking of items if items are not on the mats, or that there is no need for a restock if the mats are relatively full.

In some embodiments, sensor mats for use with the present invention are capable of identifying the exact items on the mat, based up on the sensors that are activated by the presence of the item.

Sensor mats 102 for use with the present invention may use a range of different technologies to sense the presence of items 106, the types of items, and the addition or removal of single items or multiple items. Sensing that may be used with the present invention include capacitance sensing switches, optical sensors, light-detecting cadmium sulfide sensors, and simple switches as sensing nodes. Printed mechanical switches may be used in one embodiment.

The above description refers to a block diagram of the accompanying drawings. Alternative implementations of the example represented by the block diagram includes one or more additional or alternative elements, processes and/or devices. Additionally or alternatively, one or more of the example blocks of the diagram may be combined, divided, re-arranged or omitted. Components represented by the blocks of the diagram are implemented by hardware, software, firmware, and/or any combination of hardware, software and/or firmware. In some examples, at least one of the components carrying out the functions described in the blocks is implemented by a logic circuit. As used herein, the term "logic circuit" is expressly defined as a physical device including at least one hardware component configured (e.g., via operation in accordance with a predetermined configuration and/or via execution of stored machine-readable instructions) to control one or more machines and/or perform operations of one or more machines. Examples of a logic circuit include one or more processors, one or more coprocessors, one or more microprocessors, one or more controllers, one or more digital signal processors (DSPs), one or more application specific integrated circuits (ASICs), one or more field programmable gate arrays (FPGAs), one or more microcontroller units (MCUs), one or more hardware accelerators, one or more special-purpose computer chips, and one or more system-on-a-chip (SoC) devices. Some example logic circuits, such as ASICs or FPGAs, are specifically configured hardware for performing operations (e.g., one or more of the operations described herein and represented by the flowcharts of this disclosure, if such are present). Some example logic circuits are hardware that executes machine-readable instructions to perform operations (e.g., one or more of the operations described herein and represented by the flowcharts of this disclosure, if such are present). Some example logic circuits include a combination of specifically configured hardware and hardware that executes machine-readable instructions.

The above description refers to various operations described herein and flowcharts that may be appended hereto to illustrate the flow of those operations. Any such flowcharts are representative of example methods disclosed herein. In some examples, the methods represented by the flowcharts implement the apparatus represented by the block diagrams. Alternative implementations of example methods disclosed herein may include additional or alternative operations. Further, operations of alternative implementations of the methods disclosed herein may combined, divided, re-arranged or omitted. In some examples, the operations described herein are implemented by machine-readable instructions (e.g., software and/or firmware) stored on a medium (e.g., a tangible machine-readable medium) for execution by one or more logic circuits (e.g., processor(s)). In some examples, the operations described herein are implemented by one or more configurations of one or more specifically designed logic circuits (e.g., ASIC(s)). In some examples the operations described herein are implemented by a combination of specifically designed logic circuit(s) and machine-readable instructions stored on a medium (e.g., a tangible machine-readable medium) for execution by logic circuit(s).

As used herein, each of the terms "tangible machine-readable medium," "non-transitory machine-readable medium" and "machine-readable storage device" is expressly defined as a storage medium (e.g., a platter of a hard disk drive, a digital versatile disc, a compact disc, flash memory, read-only memory, random-access memory, etc.) on which machine-readable instructions (e.g., program code in the form of, for example, software and/or firmware) are stored for any suitable duration of time (e.g., permanently, for an extended period of time (e.g., while a program associated with the machine-readable instructions is executing), and/or a short period of time (e.g., while the machine-readable instructions are cached and/or during a buffering process)). Further, as used herein, each of the terms "tangible machine-readable medium," "non-transitory machine-readable medium" and "machine-readable storage device" is expressly defined to exclude propagating signals. That is, as used in any claim of this patent, none of the terms "tangible machine-readable medium," "non-transitory machine-readable medium," and "machine-readable storage device" can be read to be implemented by a propagating signal.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. Additionally, the described embodiments/examples/implementations should not be interpreted as mutually exclusive, and should instead be understood as potentially combinable if such combinations are permissive in any way. In other words, any feature disclosed in any of the aforementioned embodiments/examples/implementations may be included in any of the other aforementioned embodiments/examples/implementations.

The benefits, advantages, solutions to problems, and any element(s) that may cause any benefit, advantage, or solution to occur or become more pronounced are not to be construed as a critical, required, or essential features or elements of any or all the claims. The claimed invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus, the following claims are hereby incorporated into the Detailed Description, with each claim standing on its own as a separately claimed subject matter.

The invention claimed is:

1. A sensor mat comprising:
a first substrate configured to form a lower portion of the mat;
a second substrate configured to form an upper portion of the mat;
a first plurality of electrical traces positioned between the first substrate and the second substrate, each of the first plurality of electrical traces being substantially parallel to each other of the first plurality of electrical traces;
a second plurality of electrical traces positioned between the first substrate and the second substrate, each of the second plurality of electrical traces being substantially parallel to each other of the second plurality of electrical traces,
the first plurality of electrical traces and the second plurality of electrical traces being laid out such that each of the first plurality of electrical traces at least one of overlaps and passes under each of the second plurality of electrical traces, the first plurality of electrical traces and the second plurality of electrical traces being further laid out such that each of the second plurality of electrical traces at least one of overlaps and passes under each of the first plurality of electrical traces;
a drive circuit communicatively coupled to each of the first plurality of electrical traces and the second plurality of electrical traces, the drive circuit including a first plurality of banks configured to interface the first plurality of electrical traces and a second plurality of banks configured to interface the second plurality of electrical traces,
wherein one of the first plurality of banks is configured to transmit sense-data to a first sub-plurality of electrical traces and one of the second plurality of banks is configured to receive sense-data from a second sub-plurality of electrical traces, the first sub-plurality of electrical traces being formed by a non-sequential series of some of the first plurality of electrical traces, the second sub-plurality of electrical traces being formed by a non-sequential series of some of the second plurality of electrical traces.

2. The sensor mat of claim 1, wherein each of the first plurality of electrical traces is positioned orthogonally to each of the second plurality of electrical traces.

3. The sensor mat of claim 1, wherein the sensor mat includes a wired power input.

4. The sensor mat of claim 1, wherein at least three of the first sub-plurality of electrical traces are equally separated from each other by a first number of some of the first plurality of electrical traces.

5. The sensor mat of claim 4, wherein at least three of the second sub-plurality of electrical traces are equally separated from each other by a second number of some of the second plurality of electrical traces.

6. The sensor mat of claim 1, wherein a ratio of the first sub-plurality of electrical traces to the second sub-plurality of electrical traces is equal to a ratio of the first plurality of electrical traces to the second plurality of electrical traces.

7. The sensor mat of claim 1 further comprising:
a controller communicatively coupled to the drive circuit, the controller being configured to:
cause the one of the first plurality of banks to transmit sense-data to the first sub-plurality of electrical traces in a first mode of operation; and
responsive to a transition from the first mode of operation to a second mode of operation, cause the one of the first plurality of banks to transmit sense-data to a third sub-plurality of electrical traces, the third sub-plurality of electrical traces being formed by a sequential series of some of the first plurality of electrical traces.

8. The sensor mat of claim 7, wherein, in the second mode of operation, the controller is further configured to cause the one of the second plurality of banks to receive sense-data from a fourth sub-plurality of electrical traces, the fourth sub-plurality of electrical traces being formed by a sequential series of some of the second plurality of electrical traces.

* * * * *